Figure 1:
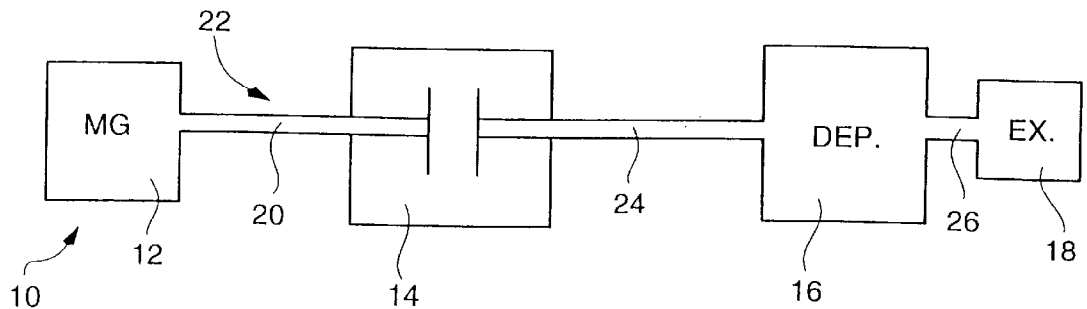

United States Patent [19]
McMillan et al.

[11] Patent Number: 5,932,295
[45] Date of Patent: *Aug. 3, 1999

[54] METHOD AND APPARATUS FOR MISTED LIQUID SOURCE DEPOSITION OF THIN FILMS WITH INCREASED YIELD

[75] Inventors: Larry D. McMillan; Carlos A. Paz de Araujo, both of Colorado Springs, Colo.

[73] Assignee: Symetrix Corporation, Colorado Springs, Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/963,083

[22] Filed: Nov. 3, 1997

Related U.S. Application Data

[63] Continuation of application No. 08/653,079, May 21, 1996, abandoned.

[51] Int. Cl.⁶ .............................. B05D 7/24; B05D 5/12; B05D 3/02; C23C 16/00
[52] U.S. Cl. .......................... 427/483; 427/485; 427/96; 427/255.1; 427/226; 427/376.6
[58] Field of Search ................................ 427/250, 252, 427/255.1, 255.2, 255.3, 475, 483, 485, 561, 564, 555, 576, 515, 512, 508, 509, 581, 597, 595, 331, 376.2, 376.3, 376.6, 376.7, 380, 383.1, 226, 96; 438/778, 785, 758

[56] References Cited

U.S. PATENT DOCUMENTS

| | | | |
|---|---|---|---|
| 3,608,821 | 9/1971 | Simm | 427/483 |
| 4,263,335 | 4/1981 | Wagner et al. | 427/483 |
| 4,279,947 | 7/1981 | Goldman et al. | 427/255.2 |
| 4,748,043 | 5/1988 | Seaver | 427/483 |
| 4,993,361 | 2/1991 | Unvala | 118/723 |
| 5,119,760 | 6/1992 | McMillan et al. | 118/722 |
| 5,138,520 | 8/1992 | McMillan et al. | 361/311 |
| 5,229,171 | 7/1993 | Donovan | 427/483 |
| 5,238,709 | 8/1993 | Wilkie | 427/475 |
| 5,250,383 | 10/1993 | Naruse | 427/483 |
| 5,316,800 | 5/1994 | Noakes et al. | 427/485 |
| 5,344,676 | 9/1994 | Kim et al. | 427/483 |
| 5,456,945 | 10/1995 | McMillan et al. | 427/252 |
| 5,534,309 | 7/1996 | Liu | 427/475 |

FOREIGN PATENT DOCUMENTS 0 347 591 A2  12/1989  European Pat. Off. .......... B05B 7/16

OTHER PUBLICATIONS

Chen et al.; "Morphology Control of Thin $LiCoO_2$ Films Fabricated Using the Electrostatic Spray Deposition (ESD) Technique"; *J. Mater. Chem.*, 1996, 6(5); pp. 765–771 No Month.

Han et al.; "$SrBi_2Ta_2O_9$ (SBT) Thin Films Prepared by Electrostatic Spray"; Integrated Ferroelectrics, 1997 No Month, vol. 14, pp. 229–235; Proceedings of The Eighth International Symposium on Integrated Ferroelectrics; Tempe, Arizona; Mar. 18–20, 1996; Part 1 of III Parts.

*Primary Examiner*—Marianne Padgett
*Attorney, Agent, or Firm*—Duft, Graziano & Forest, P.C.

[57] ABSTRACT

A mist generator produces a mist from a liquid precursor. The mist is charged and accelerated by a pair of charged electrodes in an acceleration chamber. The mist passes through a conduit charged to the same polarity of the mist particles, to a deposition chamber where they are deposited on a substrate having the opposite polarity as the particles. Infrared lamps heat the mist particles in the acceleration chamber to a temperature below the temperature at which the compounds and solvent in the liquid precursor decompose. In one embodiment the deposition chamber is tubular and a plurality of substrates are held within the chamber in a position substantially perpendicular to the direction of mist flow in the chamber. A heater and an electrical field generator in the tube add sufficient energy to the mist as it passes through the tube to provide uniform deposition of the mist on the plurality of substrates.

7 Claims, 4 Drawing Sheets

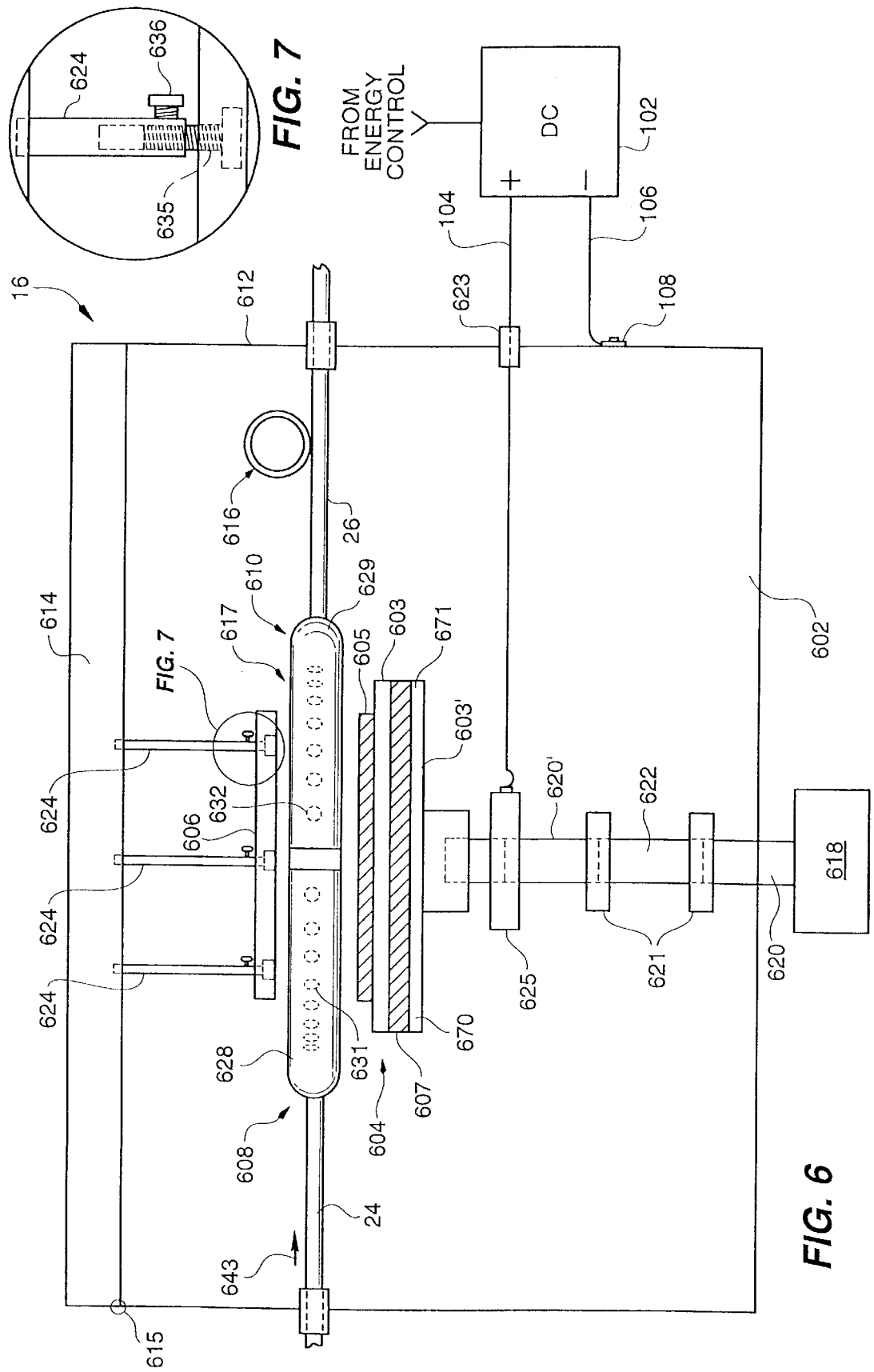

METHOD AND APPARATUS FOR MISTED LIQUID SOURCE DEPOSITION OF THIN FILMS WITH INCREASED YIELD

This application is a file wrapper continuation, application Ser. No. 08/653,079, filed May 21, 1996 now abandon.

BACKGROUND OF THE INVENTION

1. Field of the Invention

The invention relates to a method of depositing thin films for use in integrated circuits by forming a mist of a liquid, and more particularly to such a fabrication process which increases the yield of the deposition process without decomposition of the liquid in the mist.

2. Statement of the Problem

U.S. Pat. No. 5,456,945 issued Oct. 10, 1995 describes a method of misted deposition that has proven to provide thin films of complex materials that are of the high quality necessary for integrated circuit electronic devices. One reason why the method provides high quality films is that it is a low energy process, therefore the complex organic solvents and chemical compounds that are used in the process are not carbonized or otherwise destroyed in the process. However, over extreme topological features, the misted deposition process of forming the film does not provide step coverage as good as the best alternative integrated circuit fabrication processes, chemical vapor deposition. Attempts have been made to improve the step coverage by using conventional methods of adding energy used in chemical vapor deposition processes, such as heating the substrate sufficiently to significantly increase the yield. These attempts have lead to films that are carbonized, fractured and of a generally low quality that is not suitable for the fabrication of integrated circuit electronic devices. The more complex the compounds one is attempting to form, the more serious the problems. Since integrated circuit materials are tending to become more complex, and liquid source deposition processes are turning out to be the most reliable for forming thin films of very high quality, it would be highly desirable to have a liquid source deposition process that retained the high quality of the lower energy misted deposition process, but at the same time was capable of the excellent step coverage available in the CVD process.

SUMMARY OF THE INVENTION

The invention solves the above problem by providing apparatus and methods of adding energy to the mist particles in a misted deposition process without carbonizing or otherwise breaking down the complex bonds in the mist compounds and solvents.

The invention provides an electrostatic accelerator to increase the energy of the particles in a controlled manner that does not break down the chemical bonds that lead to high quality films.

Controlled heating may also be used to add a limited amount of energy to the mist particles. In one embodiment, the controlled heating is performed using low-energy infrared lamps. In another embodiment, low energy resistance heating us used in combination with an accelerator.

In another embodiment the invention solves the above problem by stacking multiple wafers on edge along the mist flow path in a tubular deposition chamber and adding energy to the particles in a controlled fashion along the tube so the wafers further along the tube experience the same deposition rates as the wafers near the entrance of the tubular deposition chamber. Preferably, additional energy is added via resistance or infrared heating, or via additional electrodes to further accelerate the mist particles as they move through the tube.

The invention provides a method of fabricating an integrated circuit, the method comprising the steps of: providing a liquid precursor comprising one or more metal compounds in a solvent; placing a substrate inside an enclosed deposition chamber; producing a mist of the liquid precursor; adding energy to the mist particles without carbonizing or otherwise breaking down the bonds in the metal compounds and solvent; flowing the mist through the deposition chamber to form a layer of the precursor liquid on the substrate; treating the liquid layer deposited on the substrate to form a film of solid material containing the one or more metals on the substrate; and completing the fabrication of the integrated circuit to include at least a portion of the film of solid material in a component of the integrated circuit. Preferably, the metal compound is selected from the group consisting of metal alkoxides and metal carboxylates. Preferably, the solvent includes a liquid selected from the group consisting of methyl ethyl ketone, isopropanal, methanol, tetrahydrofuran, xylene, n-butyl acetate, octane and 2-methoxyethanol.

In another aspect, the invention provides a method of fabricating an integrated circuit, the method comprising the steps of: providing a liquid precursor; placing a substrate inside an enclosed deposition chamber; producing a mist of the liquid precursor containing one or more metal compounds in a solvent; charging the particles in the mist; adding energy to the mist particles by accelerating the charged mist particles through an electric field; flowing the mist through the deposition chamber to form a layer of the precursor liquid on the substrate; treating the liquid layer deposited on the substrate to form a film of solid material containing the one or more metals on the substrate; and completing the fabrication of the integrated circuit to include at least a portion of the film of solid material in a component of the integrated circuit. Preferably, the step of adding energy to the mist particles further includes heating the mist particles to a temperature below the temperature at which the one or more metal compounds and solvent decompose. Preferably, the step of heating comprises applying infrared radiation to the mist particles. Preferably, the step of adding energy further comprises the step of maintaining the substrate at a polarity opposite of the polarity of the mist particles.

In a further aspect the invention provides apparatus for fabricating an integrated circuit, the apparatus comprising: a deposition chamber for containing a substrate; a substrate holder located within the deposition chamber for supporting the substrate, the substrate holder defining a substrate plane; a mist generator for forming a mist of a liquid precursor; an acceleration chamber for adding energy to the mist particles; an injection nozzle for flowing the accelerated mist through the deposition chamber substantially evenly across the substrate in a direction substantially parallel to the substrate plane to form a film of the liquid precursor on the substrate; and an exhaust assembly for withdrawing gases and mist particles from the deposition chamber. Preferably, the acceleration chamber includes a pair of electrodes and a source of an electrical voltage connected to the electrodes for charging the mist particles and then accelerating them in an electric field between the electrodes. Preferably, the acceleration chamber further includes a heater for heating the mist while it is in the acceleration chamber, and the heater comprises an infrared lamp. Preferably, the apparatus further includes a mist conduit connecting the acceleration chamber and the deposition chamber, and a source of a conduit voltage for maintaining the conduit at a polarity opposite to the polarity of the charged mist particles.

In still another aspect the invention provides apparatus for fabricating an integrated circuit comprising: a deposition chamber for containing a plurality of substrates; a mist generator for forming a mist of a liquid precursor containing one or more metal elements that will form part of the integrated circuit; a mist input conduit connecting the mist generator and one end of the deposition chamber; an exhaust assembly for withdrawing gases and mist particles from the end of the deposition chamber opposite the end connected to the mist input conduit to cause the mist to flow through the deposition chamber in a predetermined direction; and a substrate holder located within the deposition chamber for supporting the plurality of substrates in a position substantially perpendicular to the predetermined direction of mist flow, whereby the mist will deposit on the plurality of substrates as it flows through the chamber in the direction. Preferably, the apparatus further includes an acceleration chamber for accelerating particles of the mist, the acceleration chamber located between the mist generator and the deposition chamber. Preferably, the acceleration chamber includes a pair of electrodes and a source of an electrical voltage connected to the electrodes for charging the mist particles and then accelerating them in an electric field between the electrodes. Preferably, the mist conduit includes a first portion connecting the mist generator and the acceleration chamber and a second portion connecting the acceleration chamber and the deposition chamber, and the apparatus further includes a source of a conduit voltage for maintaining the second portion of the conduit at a polarity that is the same as the polarity of the charged mist particles. Preferably, the apparatus includes a heater, preferably an infrared lamp, for heating the mist while it is in the acceleration chamber. Preferably, the apparatus further includes an energy source for adding energy to the mist while passing through the deposition chamber, and the energy source comprises a differential energy source for adding energy in different amounts in different positions along the predetermined direction of flow through the chamber, the energy added in a particular position being substantially in an amount required to provide uniform deposition of the mist on the plurality of substrates. The differential energy source may comprise an electrical field generator or a heater, such as one or more infrared lamps.

In the apparatus and processes of the invention, the energy added to the mist is controlled both as to the total amount of energy added, the range of energies added, and the location in the apparatus in which the energy is added. This allows one to maximize the step coverage, without creating hot spots or random "spiking" in the mist temperature that can cause carbonation and breakdown of portions of the mist. As a result, yield is increased because the improved step coverage reduces loss due to poor step coverage, with little or no decrease in film quality. Numerous other features, objects and advantages of the invention will become apparent from the following description when read in conjunction with the accompanying drawings.

BRIEF DESCRIPTION OF THE DRAWING

FIG. 1 is a block diagram of a preferred embodiment of the misted deposition apparatus according to the invention;

FIG. 2 is a schematic diagram of an expansion, heating and electrostatic charging chamber according to the invention;

FIG. 3 is a plan view of an injection/exhaust port of the chamber of FIG. 2;

FIG. 4 is a partially cut-away view of a preferred embodiment of a tubular deposition chamber according to the invention;

FIG. 5 is a cross-sectional view of an exemplary integrated circuit as may be made by the apparatus and methods of the invention;

FIG. 6 is a cutaway side view of the deposition chamber of the apparatus according to one embodiment of the invention; and FIG. 7 is an enlarged view of a portion of FIG. 6 showing a detail of the barrier plate support.

DETAILED DESCRIPTION OF THE PREFERRED EMBODIMENT

In a misted deposition process, a liquid precursor for a material such as strontium bismuth tantalate is prepared, a mist is generated from the liquids, and the mist is flowed through a deposition chamber where it is deposited on a substrate to form a thin film of the mist on the substrate. The film and substrate are then treated by UV curing, evaporation in a vacuum, and/or baking, and then annealed to form a solid thin film of the desired material, such as strontium bismuth tantalate. The basic misted deposition apparatus and process is described in detail in U.S. Pat. No. 5,456,945 issued Oct. 10, 1995 as well as numerous other publications, so it will not be described in detail herein. As is conventional in the art, in this disclosure, the term "substrate" is used in a general sense where it includes one or number of layers of material on which the thin film may be deposited, and also in a particular sense in which it refers to a silicon wafer on which the other layers are formed. Unless otherwise indicated, it means any object on which a layer of a thin film material is deposited using the process and apparatus of the invention. Precursor liquids include sol-gel precursor formulations, which in general are comprised of metal-alkoxides in an alcohol solvent, and metallorganic precursor formulations, sometimes referred to as MOD formulations, which in general comprise a metal-carboxylate formed by reacting a carboxylic acid, such as 2-ethylhexanoic acid, with a metal or metal compound in a solvent, combinations thereof, as well as other precursor formulations.

The term "mist" as used herein is defined as fine drops of a liquid carried by a gas. The term "mist" includes an aerosol, which is generally defined a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the term aerosol, vapor, or fog.

A block diagram of the preferred embodiment of an improved misted deposition apparatus 10 according to the invention is shown in FIG. 1. The apparatus 10 includes a mist generator system 12, an acceleration system 14, a deposition chamber system 16 and an exhaust system 18. A first portion 20 of a mist conduit 22 connects the mist generator system 12 and the acceleration system 14, while a second portion 24 of the mist conduit 22 connects the acceleration system 14 and the deposition chamber 16. An exhaust conduit 26 connects the deposition chamber 16 and the exhaust system 18. The mist generator system 12 and exhaust system 18 are preferably as described in U.S. Pat. No. 5,456,945 and therefore will not be described in detail herein.

Figure 2:
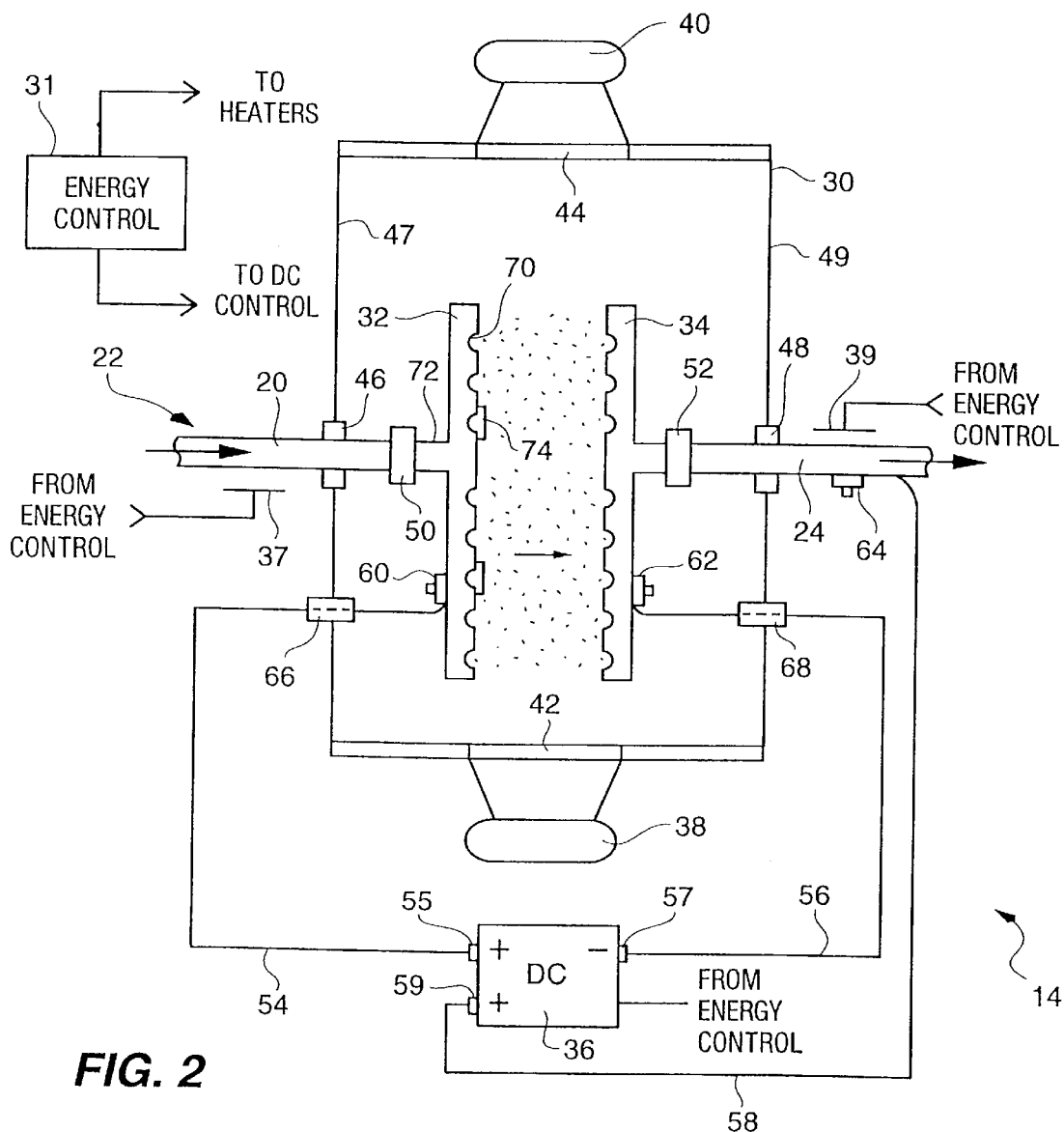
Figure 3:
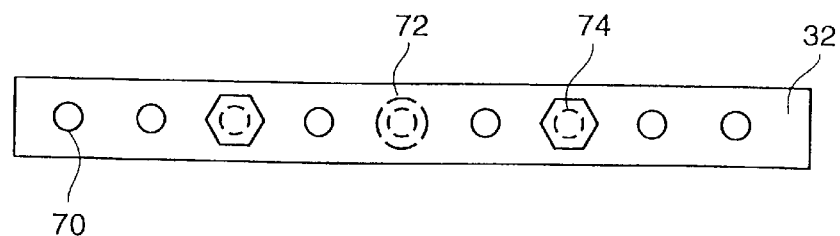

The preferred embodiment of the acceleration system 14 is shown in FIG. 2. It includes an acceleration chamber 30, an energy control circuit 31, a first electrode 32 a second electrode 34, a DC voltage source 36, heaters 38, which are preferably infrared lamps, and heaters 37 and 39, which are preferably resistance heaters. Acceleration chamber 30 is preferably made of quartz or other insulating material. However, it also may be made of stainless steel, aluminum, or other suitable metal. In latter case it would include quartz windows 42 and 44 and insulators 46 and 48, about the mist conduit portions 20 and 48 where they pass through acceleration chamber walls 47 and 49, respectively. Conduit 22 is preferably made of stainless steel tube but also may be made of brass alloy, aluminum or other suitable metals or other suitable materials. Electrode 32 are preferably made of brass alloy but also may be made of aluminum or other suitably conductive material. Insulating couplings 50 and 52 connect conduit portions 20 and 24 to electrodes 32 and 34, respectively. Electrical wires 54 and 56 connect outputs 55 and 57, respectively, of DC power source 36 with electrical terminals 60 and 62, respectively, on electrodes 32 and 34, respectively. Electrical wire 58 connects electrical output 59 on DC power source 36 with electrical terminal 64 on second conduit portion 24. Insulating feedthroughs 66 and 68 pass wires 54 and 56 through chamber walls 47 and 49, respectively. Preferably, terminals 55 and 59 are positive output terminals and terminal 57 is a negative output terminal, though they may be oppositely charged also. Insulating couplings 50 and 52 are preferably threaded plastic couplings, such as PVC, into which the threaded ends of conduit portions 20 and 24 and electrodes 32 and 34 screw. Pass throughs 46, 48 and feedthroughs 66, 68 are preferably made of an insulating plastic, such as PVC. Electrodes 32 and 34 are preferably identical and are preferably made of quarter-inch brass tubes having holes 70 formed along one side. FIG. 3 is a plan view facing the side of tube 32 on which the holes 70 are formed. Holes 70 are preferably threaded. Screws, such as 74, may be screwed into one or more of threaded holes 70 to adjust the flow of mist from electrode 32 to electrode 34.

FIG. 6 shows the preferred embodiment of the deposition chamber system 16 according to the invention. This is the same as the deposition chamber described in U.S. Pat. No. 5,456,945, and will be discussed herein only insofar as it functions in combination with the acceleration system 14. Apparatus 16 comprises a deposition chamber 602 containing a substrate holder 604, a barrier plate 606, an mist input assembly 608, an exhaust nozzle assembly 610, and an ultraviolet radiation source 616. The deposition chamber 602 includes a main body 612, a lid 614 which is securable over the main body 612 to define an enclosed space within the deposition chamber 612. The chamber is connected to a plurality of external vacuum sources 18 via exhaust conduit 26, which external vacuum sources will not be described in detail herein. Lid 614 is pivotally connected to the main body 612 using a hinge as indicated at 615. In operation, a mist and inert carrier gas are fed in through conduit 24, in direction 643, and pass through mist input assembly 608, where the mist is deposited onto substrate 605. Excess mist and carrier gas are drawn out of deposition chamber 602 via exhaust nozzle 610.

Substrate holder 604 is made from two circular plates 603, 603' of electrically conductive material, such as stainless steel, the top plate 603 being insulated from the bottom plate (field plate) 603' by an electrically insulative material, such as delrin. In an exemplary embodiment, utilizing a 4-inch diameter substrate, substrate holder 604 is nominally 6 inches in diameter and supported on a rotatable shaft 620 which is in turn connected to a motor 618 so that holder 604 and substrate 605 may be rotated during a deposition process. An insulating shaft 622 electrically insulates the substrate holder 604 and substrate 605 supported thereon from the DC voltage applied to the deposition chamber main body 612 so that a DC bias can be created between the substrate holder 604 and barrier plate 606 (via chamber main body 612). The bias of substrate 605 is preferably the opposite of the bias of electrode 32 (FIG. 2), i.e. negative in the embodiment shown. Insulating shaft 622 is connected to shaft 620 and shaft 620' by couplings 621. Electrical source 102 is operatively connected to main body 612 of deposition chamber 602 at connection 108 by lead 106 and via feedthrough 623 to brass sleeve 625 by lead 104 to effect a DC bias between field plate 603' and barrier plate 606.

Barrier plate 606 is made of an electrically conductive material such as stainless steel, and is of sufficiently large size to extend substantially over the substrate 605 in parallel thereto so that a vaporized source or mist as injected through input conduit 24 and mist input assembly 608 is forced to flow between barrier plate 606 and the substrate holder 604 over the substrate 605. Barrier plate 606 is preferably the same diameter as the substrate holder 604. The barrier plate 606 is steerably connected to the lid 614 by a plurality of rods 624 so that the plate 606 will be moved away from the substrate 605 whenever the lid is opened. The barrier plate 606 also includes a UV transmitting window (not shown in FIG. 6).

FIG. 7 shows a detail of the connection of rods 624 to barrier plate 606. Each of the rods 624 is typically a stainless steel rod attached to deposition chamber lid 614. Each rod 624 is bored to accommodate a bolt 635 by which the rod 624 is attached to barrier plate 606. Each rod 624 is tapped to accommodate a set screw 636 which secures bolt 635 to the rod 624. By loosening set screw 636, repositioning rod 624 relative to bolt 635, and then re-tightening set screw 636, the effective length of each rod is adjustable up to ½ inch without having to remove the rod 624 from the chamber lid 614. Each of the rods 624 is removable to allow sets of rods 624 of different lengths to be substituted to coarsely adjust the corresponding spacing between barrier plate 606 and substrate holder 604 (and substrate 605) depending on the source materials, flow rate, etc. For example, the rod length may be adjusted to provide a spacing in the range of 0.10–2.00 inches. Once in place, rods 624 are also adjustable as indicated above. Thus, rods 624, bolts 635, and set screws 636 comprise an adjusting means for adjusting the barrier plate 606. The spacing between substrate holder 604 and barrier plate 606 is preferably approximately between 0.375 inches and 0.4 inches when a precursor liquid of barium strontium titanate is to deposited.

The mist input nozzle assembly 608 and the exhaust nozzle assembly 610 are more particularly described in U.S. Pat. No. 5,456,945. Input nozzle assembly 608 includes an input conduit 24 which receives a misted solution from acceleration chamber 14 (FIG. 3) via conduit 24. Input conduit 24 is connected to arcuate tube 628 which has a plurality of small holes or input ports 631 for accepting removable screws (not shown) spaced along the inner circumference of the tube 628. Likewise, exhaust 610 comprises an arcuate exhaust tube 629 having a plurality of small holes or exhaust ports 632 with removable screws (not shown). The structure of the exhaust nozzle assembly 610 is substantially the same as that of the mist input assembly 608, except that a conduit 26 leads to a vacuum exhaust source 18 (FIG. 1). Arcuate tube 628 of mist input nozzle assembly 608 and the corresponding arcuate tube 629 of exhaust assembly 610 respectively surround oppositely disposed peripheral portions 670 and 671, respectively, of substrate holder 604. Substrate holder 604, barrier plate 606, input assembly 608 and exhaust nozzle assembly 610 collectively cooperate to define a relatively small, semienclosed deposition area 617 surrounding an upper/exposed surface of the substrate 605, and within which the vaporized solution is substantially contained throughout the deposition process. As discussed in detail in U.S. Pat. No. 5,456,945, a key aspect of the apparatus shown in FIGS. 6 and 7 is that the mist is flowed across the substrate via multiple input ports 631 and exits the area above the substrate via multiple exhaust ports 632, with the ports being distributed in close proximity to and about the periphery of the substrate 605 to create a substantially evenly distributed flow of mist across the substrate 605 in a direction substantially parallel to the substrate plane to form a film of the liquid precursor on the substrate 605.

Figure 4:
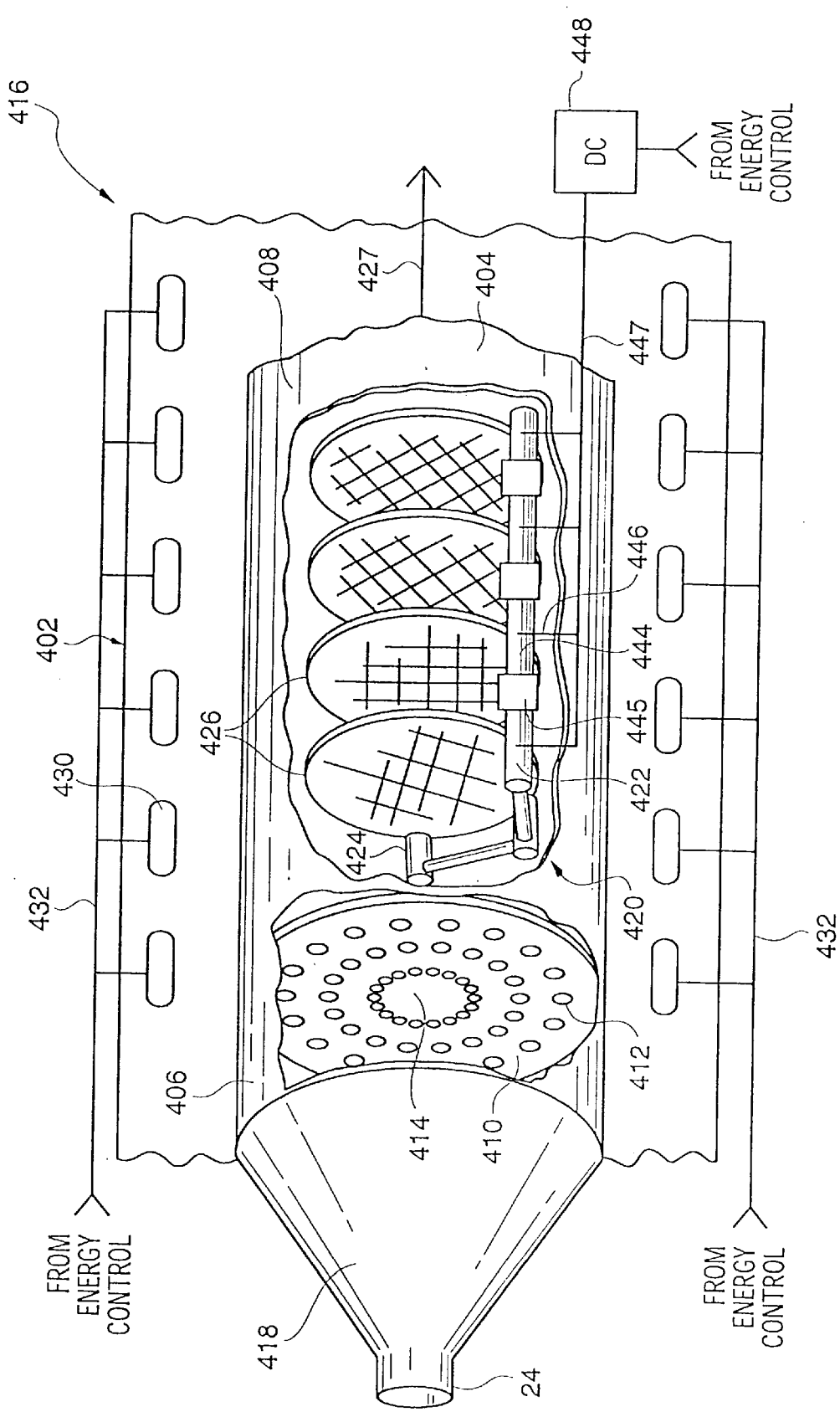

FIG. 4 shows an alternative embodiment of a deposition chamber system 416 in accordance with the invention. It includes an outer housing 402 that does not need to be vacuum tight, and an inner tubular chamber 404 that is vacuum tight inner chamber 404 includes an expansion chamber portion 406 and a deposition chamber portion 408 that are separated by a partition 410 having a plurality of bores 412 through it that allow the mist to pass. Preferably, there are no bores formed in the area 414 that is near the axis of the conduit 24 and tubular chamber 408 which prevents streaming of the mist directly from conduit 24 into chamber 408. Expansion chamber 406 includes a tubular portion 415 and a cone-shaped portion 418 that connects conduit portion 24 with the tubular portion 415. Mounted within tubular deposition chamber 408 is a cradle 420 formed of three interconnected wafer supports, such as 422. Each wafer support, has a series of notches, such as 424, formed in it into which the edges of a plurality of substrates 426 fit to hold the substrates in a position substantially perpendicular to the axis 427 of chamber 408. An arrowhead has been placed on axis 427 to show the direction of mist flow in the chamber 408. In one embodiment one of more of the wafer supports 422 is made of conducting members, such as 444, connected by insulating couplings, such as 445. In this embodiment, each conducting member 444 is separately connected to a wire, such as 446; the wires 446 are bundled into cable 447 which connects to DC source 448 which is controlled by energy control 31 (FIG. 2). Mounted within housing 402 are a plurality of heating elements 430, which preferably are infrared lamps. Each of lamps 430 is connected via a cable 432 to energy control circuit 31 (FIG. 2). Energy control circuit 31, conducting members 444, cables 447 and 432, and heating elements 430 form a differential energy source that allows energy to be added to the mist in different amounts in different positions along the direction of mist flow during the deposition process. Preferably, the energy added at each position, either by the additional electric field provided via a conducting member 444 along tubular chamber 408 or additional heat energy provided via a heater 430 along tubular chamber 408, is substantially in an amount required to provide uniform deposition of the mist on the plurality of substrates. Generally, this is done by adding just enough energy at each position to make up for the energy lost by the mist as it travels down the tubular chamber 408. That is, the energy added is just enough to keep the average energy of the mist particles constant as the mist travels down chamber 408.

Tubular chamber 404 is preferably formed of glass or a plastic that is transparent or at least translucent to infrared radiation. Housing 402 is preferably made of stainless steel, aluminum, or other suitable material.

The invention is operated as follows. Mist particles travel from mist generator 12 through mist conduit portion 20 to electrode 32. Mist conduit 20 may be heated to a temperature slightly above the temperature of the mist, to prevent the mist from condensing out on the conduit. Such condensation both decreases the energy of the mist and causes mist particles to increase in size, which can create defects in the thin film deposited. The amount of energy applied is controlled by mist control circuit 31. The energy applied by mist generator is sufficient to strip some electrons from some mist particles charging them. Additional electrons are stripped from the mist partides when emerging from electrode 32 by the positive voltage on electrode 32, or in other words, the energy of the electric field between electrodes 32 and 34. The charged particles accelerate toward the negatively charged electrode 34. Collisions between mist particles can strip further electrons and further charge the particles. However, the energy added by the field between the electrodes 32 and 34 is kept low enough so that the neither the organic bonds in the precursor solution are broken nor is the precursor solvent broken down. The non-charged particles move from the first electrode to the second electrode 34 as well as the charged particles because there is a pressure differential between the electrodes created by the exhaust system 18. As they move through acceleration chamber 14 and from acceleration chamber 14 into deposition chamber 16, the non-charged particles will pick up energy due to collisions with the charged particles. Further, all particles pick up energy from heaters 40. Thus, all particles, charged, and non-charged are accelerated. It is important to recognize that while in the preferred embodiment, the electric field between the electrodes accelerates the mist generally in the direction of flow of the mist, the direction of acceleration is not as important at the fact that the particles are accelerated. It should further be understood that the term acceleration here means absolute acceleration; that is, the speed of the particles increases. While the velocity (speed with a direction attached) increases more in the direction of the electric field, the particular direction of the increase is not as important at the fact that energy is added to the mist.

After being accelerated in acceleration chamber 14, the mist particles pass in to conduit portion 24. Conduit portion 24 is preferably heated by a resistance heater to prevent the particles from losing energy due to collisions with the conduit walls. Preferably, the heating is just slightly higher, i.e about 10 degrees or so, above the temperature of the mist, so as not to break down the bonds of the precursor compounds and solvent. Turning to FIG. 6, the mist is then flowed through deposition chamber 16. Preferably, the substrate 605 is held at a polarity that is opposite to the polarity of the mist, thereby further increasing the energy of the particles. Barrier plate 606 is held at the opposite polarity to repel the particles toward the substrate. Thus, a field between the barrier plate and the substrate increases the energy of the particles. Again, the increase is small, below the amount which would cause organic bonds desirable in the final thin film to break If the deposition chamber system 416 is used, the mist particles enter expansion chamber 406, which is sufficiently large to allow the particles to distribute themselves substantially uniformly throughout the chamber before they move through bores 412 into deposition chamber 408. Expansion chamber 406 is also preferably long enough so that particles that are so large as to potentially cause defect problems fall under the influence of gravity to a position below the substrates 426. This chamber has several advantages over the chamber of FIG. 6. First multiple substrates may be deposited at once, increasing the yield. Further, large particles, which may result in defects in the final thin film, tend to sink to the bottom of expansion chamber 406 and deposition chamber 408, thus do not deposit on the substrates. This results in a finer particle distribution and better step coverage. As the mist deposits on the substrates 426, the average mist energy goes down. However, the heaters and electrodes, under control of the energy control 31 add energy to the mist, so the average rate of deposition does not decrease from the first of the substrates to the last.

During, after, or both during and after deposition, the precursor liquid is treated to form a thin film of solid material 522 (FIG. 5) on the substrate 605. In this context, "treated" means any one or a combination of the following: exposed to vacuum, ultraviolet radiation, electrical poling, drying, and heating, including baking and annealing. In the preferred embodiment, UV radiation is optionally applied to the precursor solution during deposition. The ultraviolet radiation is preferably also applied after deposition. After deposition, the material deposited on the substrate, which is liquid in the preferred embodiment, is preferably exposed to vacuum for a period, then is baked and then annealed. The preferred process of the invention is one in which the misted precursor solution is deposited directly on the substrate and the dissociation of the organics in the precursor that do not form part of the desired material and removal of the solvent and organics or other fragments takes place primarily after the solution is on the substrate. However, in another aspect the invention also contemplates a process in which the final desired chemical compound or an inter mediate compound is separated from the solvent and organics during the deposition and the final desired chemical compound or an intermediate compound is deposited on the substrate. In both aspects, preferably, one or more bonds of the precursor pass through to the final film. After the formation of the solid thin film of the desired material 522, such as barium strontium titanate, strontium bismuth titanate and other such materials, the integrated circuit 500 is completed. The fabrication of the integrated circuit 500 is such as to include at least a portion of the film of solid material 522 in a component of the integrated circuit 500.

Figure 5:
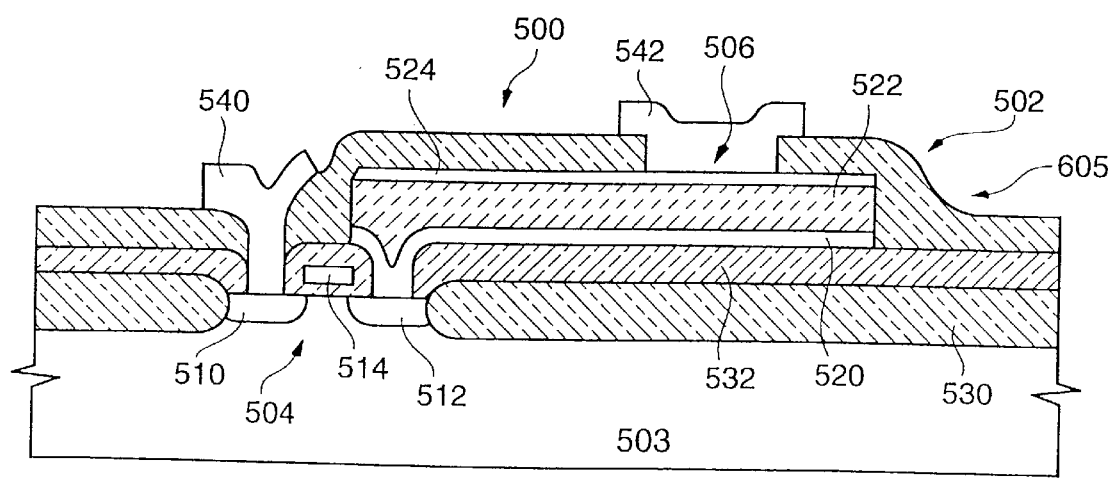

FIG. 5 shows an example of a portion of an integrated circuit 500 as may be fabricated by the apparatus and methods of the invention. This particular circuit portion is a single memory cell 502 of a 1T/1C (one transistor/one capacitor) DRAM that is a well-known integrated circuit in the art. Cell 502 is fabricated on a silicon wafer 503 and includes a transistor 504 and a capacitor 506. Transistor 504 includes a source 510, a drain 512, and a gate 514. Capacitor 506 includes a bottom electrode 520, a dielectric 522, and a top electrode 524. Field oxide regions 530 formed on the wafer 503 separate the various cells in the integrated circuit, and insulating layers, such as 532, separate the individual electronic elements, such as transistor 504 and capacitor 506. The bottom electrode 520 of capacitor 506 is connected to the drain 514 of transistor 504. Wiring layers 540 and 542 connect the source of the transistor 504 and the top electrode of capacitor 506, respectively, to other portions of the integrated circuit 500. The method of the invention has been used to deposit a BST (barium strontium titanate) dielectric as the material 522, though it also may be used to deposit other elements of the circuit, such as insulator 520. In this case the immediate substrate 605 on which the material 522 is deposited is the bottom electrode 522, but more generally may be thought of as the incomplete integrated circuit, including wafer 503 and layers 530, 532 and 520 on which the material 522 is deposited. The method of the invention has also been used to deposit a ferroelectric, such as strontium bismuth tantalate, as the material 522. In this case, the integrated circuit is an FERAM, or ferroelectric memory cell.

In the above description one example of the process according to the invention has been disclosed in which the mist, as a whole, flows into and through the deposition chamber in a direction essentially parallel to substrate plane, i.e., the embodiment of FIG. 6, and another example of the process according to the invention has been disclosed in which the mist flows into and through the deposition chamber in a direction essentially normal to the substrate plane, i.e., the embodiment of FIG. 4. It clear that there is movement of individual mist particles in directions different than the general flow of the mist, since otherwise there would be no deposition at all in the case of the embodiment of FIG. 6, and there would be deposition only on the first of the wafers in the embodiment of FIG. 4. It is contemplated by the invention that the direction of the mist introduction into the deposition chamber can be any direction between the direction of FIG. 6 and the direction of FIG. 4. That is the mist, as a whole, may be introduced into and flow through the deposition chamber in any direction relative to the substrate plane, including at an angle to the substrate plane.

In both embodiments shown the acceleration chamber is a separate chamber from the deposition chamber. However, the invention contemplates that the acceleration electrodes may share the same chamber with the mist input assembly 608 and the exhaust assembly 610. Depositions have in fact been successfully accomplished using the barrier plate 606 as one electrode 32 and the substrate 605 as the other electrode 34. However, the best particle energy control thus far has been found in an embodiment in which the acceleration chamber and the deposition chamber are different.

Further details of the apparatus and process of the invention are as described in the art, such as U.S. Pat. No. 5,456,945, and thus will not be discussed in detail herein.

Although there has been described what is at present considered to be the preferred embodiments of the invention, it will be understood that the invention can be embodied in other specific forms without departing from its spirit or essential characteristics. Now that the advantage of using the controlled addition of energy and the use of multiple wafers stacked on edge along the direction of mist flow in a tubular chamber to increase yield have been shown, many modifications and variations of these principles may be devised. The present embodiments are, therefore, to be considered as illustrative and not restrictive. The scope of the invention is indicated by the appended claims.

We claim:

1. A method of fabricating an integrated circuit, said method comprising steps of:

(a) providing a liquid precursor comprising a metal compound in a solvent;

(b) placing a substrate inside an enclosed deposition chamber;

(c) suspending said liquid precursor in a gas to produce a mist of said liquid precursor;

(d) charging said mist;

(e) adding energy to said mist without carbonizing or otherwise breaking down bonds in said metal compound and said solvent;

(f) flowing said mist through said deposition chamber to form a layer of said precursor liquid on said substrate;

(g) treating the liquid layer deposited on said substrate to form a thin film of solid material containing said metal on said substrate; and (h) completing the fabrication of said integrated circuit to include at least a portion of said thin film of solid material in a component of said integrated circuit.

2. The method of claim 1, wherein said metal compound is selected from the group consisting of metal alkoxides and metal carboxylates.

3. The method of claim 1 wherein said solvent includes a liquid selected from the group consisting of methyl ethyl ketone, isopropanal, methanol, tetrahydrofuran, xylene, n-butyl acetate, octane and 2-methoxyethanol.

4. A method of fabricating an integrated circuit, said method comprising steps of:

(a) providing a liquid precursor comprising a metal compound in a solvent;

(b) placing a substrate inside an enclosed deposition chamber;

(c) suspending said liquid precursor in a gas to produce a mist of said liquid precursor, said mist containing mist particles;

(d) charging said particles in said mist;

(e) adding energy to said mist particles by accelerating said charged mist particles through an electric field;

(f) flowing said mist through said deposition chamber to form a layer of said precursor liquid on said substrate;

(g) treating said liquid layer deposited on said substrate to form a thin film of solid material containing said metal on said substrate; and (h) completing the fabrication of said integrated circuit to include at least a portion of said thin film of solid material in a component of said integrated circuit.

5. The method of claim 4 wherein said step of adding said energy to said mist particles further includes heating said mist particles to a temperature below the temperature at which said one or more metal compounds and solvent decompose.

6. The method of claim 5 wherein said step of heating comprises applying infrared radiation to said mist particles.

7. The method of claim 4 wherein said step of adding said energy comprises the step of maintaining said substrate at a polarity opposite of the polarity of said mist particles.

* * * * *